(12) United States Patent
Ata et al.

(10) Patent No.: US 10,109,465 B2
(45) Date of Patent: Oct. 23, 2018

(54) COIL FILAMENT FOR PLASMA ENHANCED CHEMICAL VAPOR DEPOSITION SOURCE

(71) Applicant: Seagate Technology LLC, Cupertino, CA (US)

(72) Inventors: Romulo Ata, San Jose, CA (US);
ZhaoHui Fan, Fremont, CA (US);
Samuel Tanaka, Fremont, CA (US);
Christopher Platt, Fremont, CA (US);
Xiaoding Ma, Fremont, CA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 15/533,265

(22) PCT Filed: Nov. 20, 2015

(86) PCT No.: PCT/US2015/061756
§ 371 (c)(1),
(2) Date: Jun. 5, 2017

(87) PCT Pub. No.: WO2016/089620
PCT Pub. Date: Jun. 9, 2016

(65) Prior Publication Data
US 2017/0365448 A1    Dec. 21, 2017

Related U.S. Application Data

(60) Provisional application No. 62/088,345, filed on Dec. 5, 2014.

(51) Int. Cl.
*H01J 1/94* (2006.01)
*H01J 37/32* (2006.01)
(Continued)

(52) U.S. Cl.
CPC ........ *H01J 37/32568* (2013.01); *C23C 16/26* (2013.01); *C23C 16/50* (2013.01);
(Continued)

(58) Field of Classification Search
USPC .......................................... 313/279, 271, 272
See application file for complete search history.

(56) References Cited

U.S. PATENT DOCUMENTS 5,879,450 A   3/1999  Lee et al.
6,582,780 B1  6/2003  Tolt
(Continued)

OTHER PUBLICATIONS

International Search Report and Written Opinion for International Application No. PCT/US2015/061756, dated Mar. 11, 2016, 12 pages.

*Primary Examiner* — Vip Patel
(74) *Attorney, Agent, or Firm* — Westman, Champlin & Koehler, P.A.

(57) ABSTRACT

A vapor deposition source that includes a substantially vertical plate to which first and second filament posts are coupled. The vapor deposition source also includes a filament having a first end and a second end. The filament provides a substantially concentric source of electrons. The first end of the filament is connected to the first filament post and the second end of the filament is connected to the second filament post. The first end of the filament is substantially vertically aligned with the second end of the filament when the filament is connected to the first and second posts.

20 Claims, 8 Drawing Sheets

(51) Int. Cl.
  *H01K 1/18* (2006.01)
  *C23C 16/26* (2006.01)
  *C23C 16/50* (2006.01)

(52) U.S. Cl.
  CPC ...... *H01J 37/3233* (2013.01); *H01J 37/3244* (2013.01); *H01J 37/32403* (2013.01); *H01J 37/32449* (2013.01); *H01J 37/32541* (2013.01); *H01K 1/18* (2013.01); *H01J 2237/032* (2013.01); *H01J 2237/3321* (2013.01)

(56) References Cited

U.S. PATENT DOCUMENTS

| | | |
|---|---|---|
| 2006/0130763 A1 | 6/2006 | Emerson et al. |
| 2006/0157472 A1 | 7/2006 | Mashima et al. |
| 2006/0269671 A1 | 11/2006 | Kim et al. |
| 2016/0163517 A1* | 6/2016 | Tanaka .............. H01J 37/32403 313/279 |

* cited by examiner

COIL FILAMENT FOR PLASMA ENHANCED CHEMICAL VAPOR DEPOSITION SOURCE

CROSS-REFERENCE TO RELATED APPLICATION

This Application is a Section 371 National Stage Application of International Application No. PCT/US2015/061756, filed 20 Nov. 2015 and published as WO 2016/089620 A1 on 9 Jun. 2016, in English, the contents of which are hereby incorporated by reference in their entirety.

BACKGROUND

Data storage systems commonly have one or more data storage media and one or more elements (for example, read/write heads) that communicate with the data storage media to store and retrieve data. Data storage media may be magnetic storage media, optical storage media, etc. Magnetic storage media such as magnetic discs may comprise a substrate on which a non-magnetic underlayer, a magnetic layer and a protective overcoat are deposited using a suitable technique.

A plasma enhanced chemical vapor deposition technique may be used to deposit the protective overcoat. This technique may employ a deposition source having a filament for emitting electrons.

SUMMARY

A first apparatus embodiment includes a vapor deposition tool having a plasma enhanced chemical vapor deposition (PECVD) source. The PECVD source includes a vertically positioned filament that is configured to provide a substantially concentric source of electrons. The vertically positioned filament includes a first end and a second end. The first end of the filament is substantially vertically aligned with the second end of the filament.

A second apparatus embodiment is directed to a vapor deposition source. The vapor deposition source includes a substantially vertical plate to which first and second filament posts are coupled. The vapor deposition source also includes a filament having a first end and a second end. The filament is configured to provide a substantially concentric source of electrons. The first end of the filament is connected to the first filament post and the second end of the filament is connected to the second filament post. The first end of the filament is substantially vertically aligned with the second end of the filament when the filament is connected to the first and second posts.

A third apparatus embodiment is directed to a filament. The filament includes a first end configured to couple to a first filament post of a chemical vapor deposition source, and a second end configured to couple to a second filament post of the chemical vapor deposition source. The filament also includes a first curved arm connected to the first end of the filament, and a second curved arm connected to the second end of the filament. A transition region is included between the first curved arm and the second curved arm. A first end of the transition region is connected to the first curved arm and a second end of the transition region is connected to the second curved arm.

A method embodiment includes providing a filament wire, and shaping the filament wire to include multiple curved features including a first curved arm and a second curved arm. The method also includes providing a transition feature between the first curved arm and the second curved arm. The method further includes connecting first and second ends of the filament to a vertical plate in a chemical vapor deposition source with the first end of the filament vertically aligned with the second end of the filament.

DETAILED DESCRIPTION OF ILLUSTRATIVE EMBODIMENTS

Embodiments described below relate to one or more elements used in a process for depositing a protective overcoat on a data storage medium.

In some embodiments, a plasma enhanced chemical vapor deposition (PECVD) process may be used to deposit the protective overcoat on the data storage medium. The PECVD process may employ a deposition source having a filament for emitting electrons. In a particular embodiment, a carbon overcoat source, which uses a hot filament cathode capable of emitting electrons by thermionic emission, is utilized in the PECVD process to deposit a carbon overcoat on a magnetic data storage medium (for example, a magnetic data storage disc).

During operation of the carbon overcoat source, the carbon overcoat source filament may be heated to about 2500 K (degree Kelvin) to produce electrons by thermionic emission in vacuum. The high temperature combined with the force of gravity may result in sagging of the filament. The carbon process may result in uneven carburization of the filament, which combined with the gravitational forces and the inherent stresses created in the filament during its fabrication, may result in distortion of the filament in multiple dimensions.

The carbon (media overcoat) uniformity is directly affected by the shape, position, and carburization of the carbon overcoat source filament that acts as the primary electron source. Improved protective overcoat uniformity improves both mechanical and electrical performance in a data storage device that includes the magnetic medium by, for example, reducing spacing variations between a read/write head and the medium.

Figure 1A:
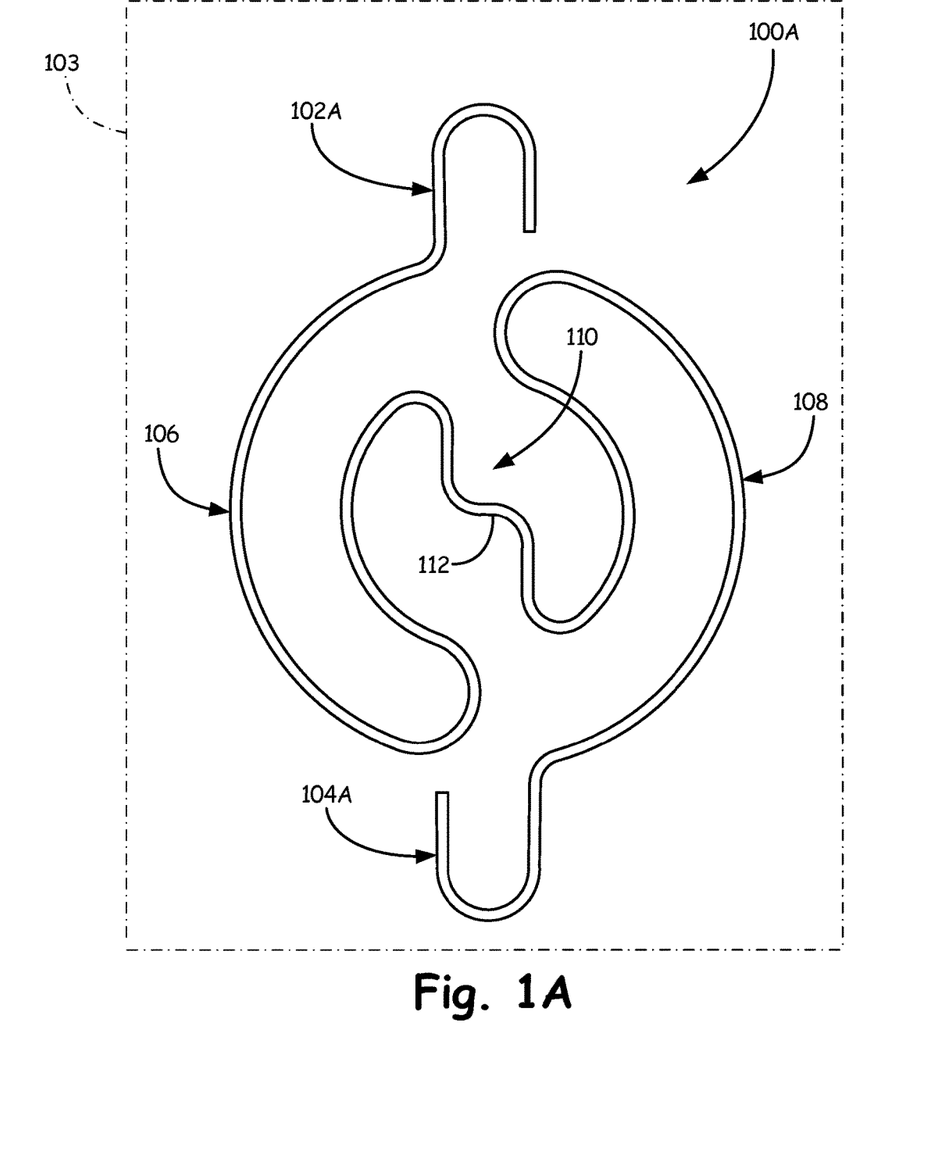
FIG. 1A is a diagrammatic illustration of a filament in accordance with one embodiment.
Figure 1B:
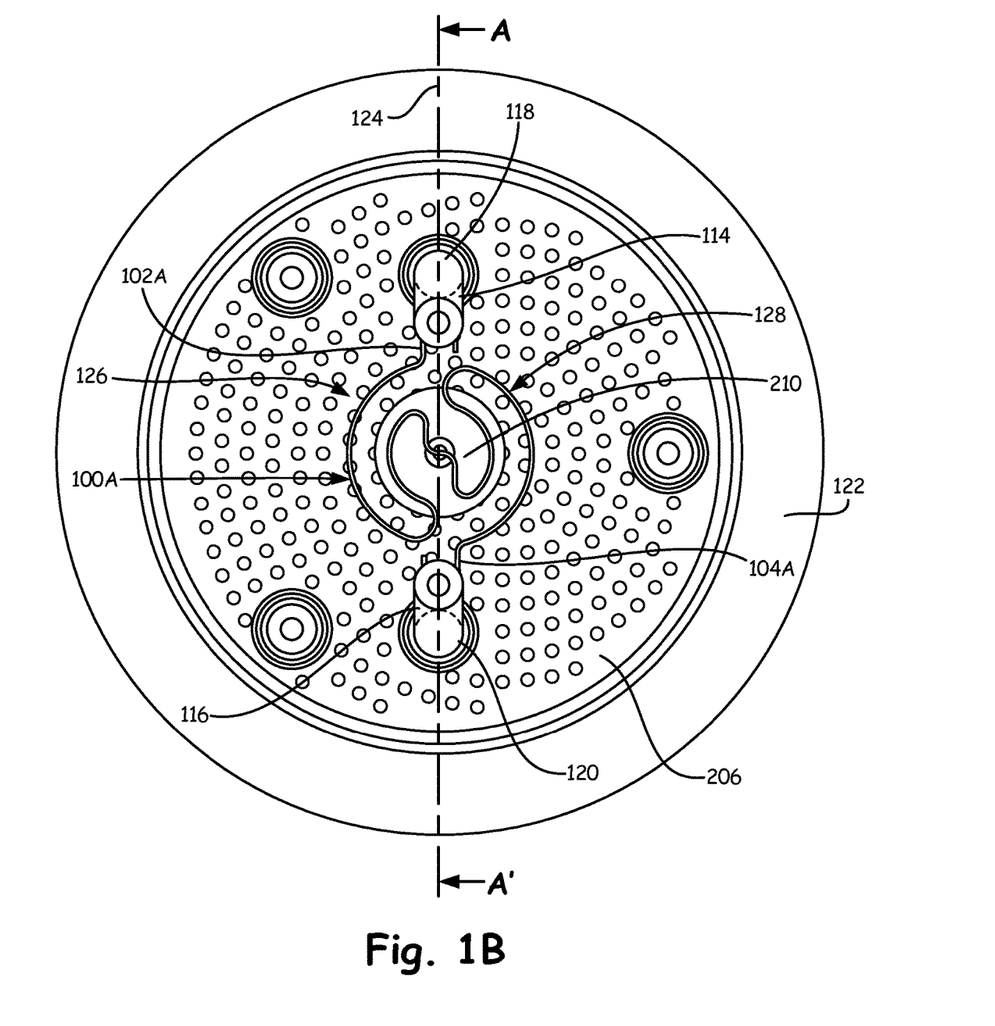
FIGS. 1B and 1C are diagrammatic illustrations showing filaments connected to plates of a deposition source in accordance with one embodiment.
Figure 1C:
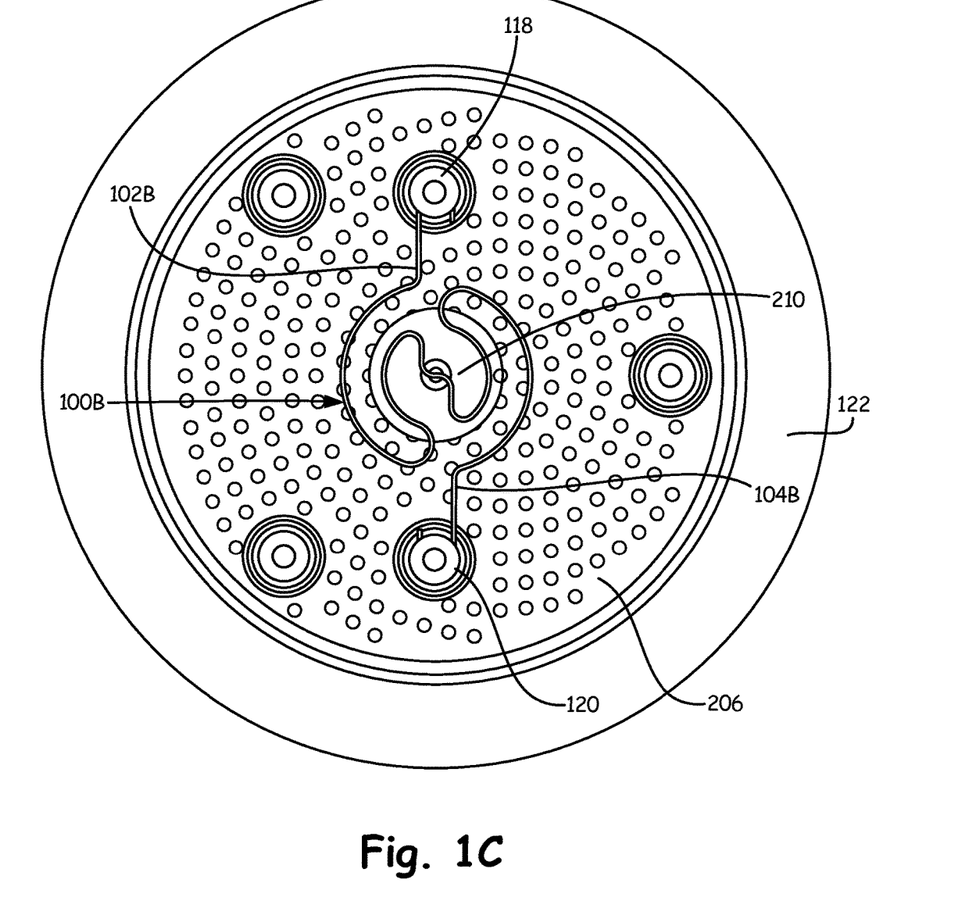

FIGS. 1A through 1C together illustrate a configuration of a carbon overcoat source filament 100A, 100B and a connection of the carbon overcoat source filament 100A, 100B to filament posts mounted on a plate of a PECVD source, such that a first filament end connected to a first filament post is substantially vertically aligned with a second filament end connected to a second filament post. It should be noted that the same reference numerals are used in different figures for same or similar elements. Filament 100A, 100B is designed to provide a substantially concentric source of electrons by using a substantially circular or coil shape pattern. As will be described further below, by mounting filament 100A, 100B on a plate of a PECVD source such that a first filament end connected to a first filament post is substantially vertically aligned with a second filament end connected to a second filament post, the shape of filament 100A, 100B can be maintained through the lifetime of filament 100A, 100B.

Filament 100A, 100B is a holeless conducting wire with a high melting point, forming part of the PECVD source that is described further below. As can be seen in FIG. 1A, filament 100A includes a first end 102A and a second end 104A. In the embodiment shown in FIG. 1A, both first end 102A and second end 104A are hook shaped. However, first end 102A and second end 104A may be of any suitable shape depending on, for example, a shape/configuration of a post to which the filament 100A is to be connected. Filament 100A also includes a first curved arm 106 that extends from the first end 102A and a second curved arm 108 that extends from the second end 104A. As can be seen in FIG. 1A, each of the curved arms 106, 108 is semi-circular or "banana-shaped" and the arms 106 and 108 are connected via a central or transition region 110. In the embodiment shown in FIG. 1A, the transition region 110 includes a step-shaped feature 112. However, in different embodiments, either no step-shaped feature 112 may be included in transition region 110 or any other suitably shaped feature may be included in transition region 110 instead of step-shaped feature 112. In the embodiment shown in FIG. 1A, the first curved arm 106 and the second curved arm 108 are disposed substantially in a same plane 103 (i.e., the plane of FIG. 1A).

FIG. 1B shows filament 100A coupled to filament posts extenders connected to filament posts mounted on a plate of a PECVD source. As can be seen in FIG. 1B, first end 102A of filament 100A is connected to a first filament post extender 114 and second end 104A of filament 100A is connected to a second filament post extender 116. The filament 100A is unsupported between the first end 102A and the second end 104A. First filament post extender 114 is connected to a first filament post 118 and second filament post extender 116 is connected to second filament post 120. Filament posts 118 and 120 are mounted on a plate 122 of a PECVD source, which is described further below. As will be described further below, a plate such as 122 is vertically mounted in the PECVD source. A vertical axis 124 that passes through filament posts 118 and 120 is shown in FIG. 1B. In FIG. 1B, vertical axis 124 divides filament 100A into two halves 126 and 128 that are substantially symmetric with respect to the vertical axis 120. Filament 100A is designed to be substantially circular and concentrically symmetric. It should be noted that a total filament length, a number of turns, bend radius and other special dimensions of filament 100A may differ in different embodiments based on variations in filament post configurations, variations in separation distance between filament posts, etc. Step feature 112 helps prevent deformation in a direction perpendicular to the plane of the filament.

FIG. 1C shows an embodiment filament 100B in which the ends of the filament are directly connected to the filament posts 118 and 120 and therefore no filament post extenders such as 114 and 116 are used in this embodiment. In order to enable the elimination of the filament post extenders such as 114 and 116, in this embodiment, a separation distance between a first end 102B and a second end 104B of filament 100B is greater that a separation distance between first end 102A and second end 104A of filament 100A of FIG. 1B. In other respects filament 100B is substantially similar to filament 100A and therefore a description of the remaining components or 100B is not included.

Figure 2:
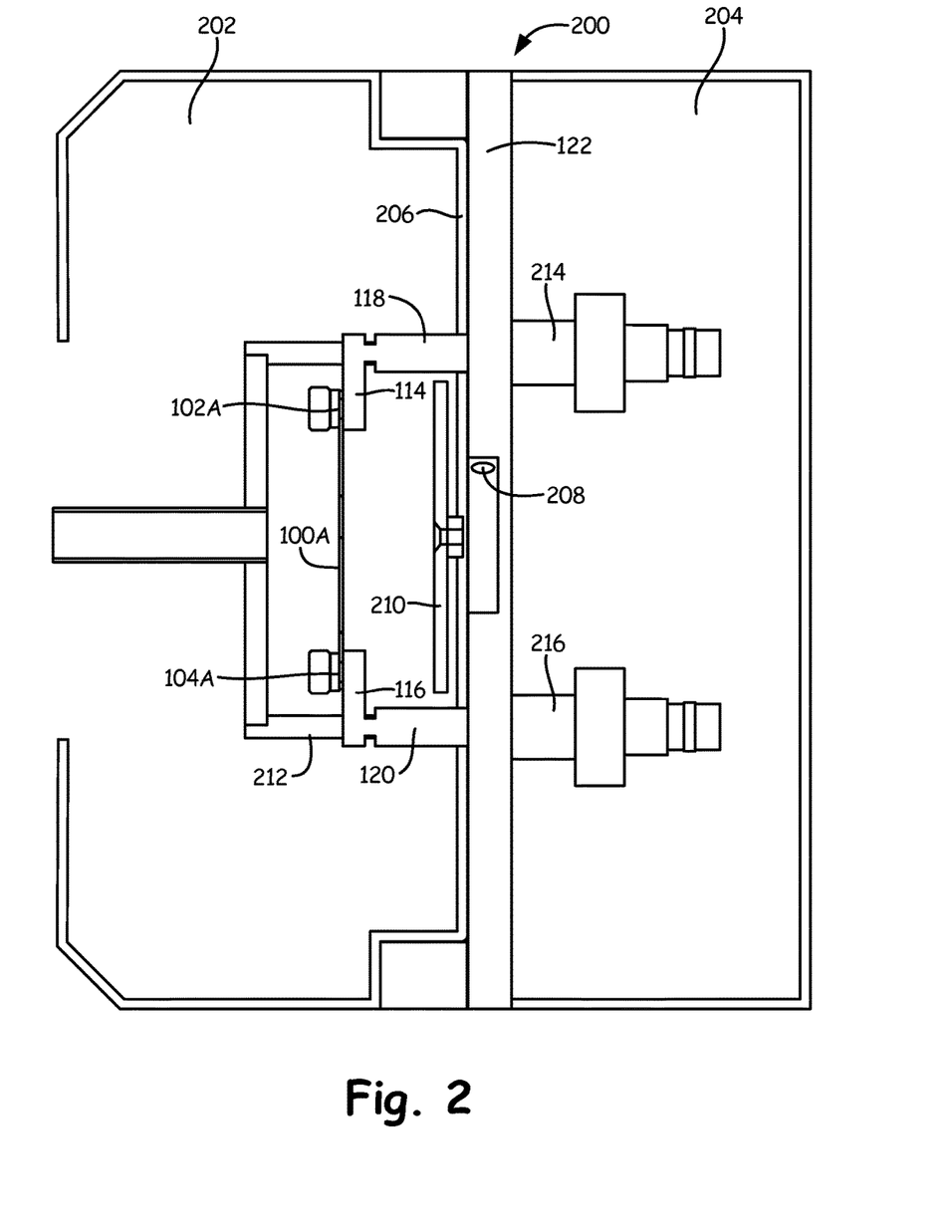
FIG. 2 is a diagrammatic illustration that shows a side sectional view of a single chemical vapor deposition source of a deposition tool.

FIG. 2 is a diagrammatic illustration that shows a side sectional view of a single PECVD source 200 of a carbon deposition tool. The side section view is along line A-A' of FIG. 1B. PECVD source 200 is capable of depositing a carbon overcoat on one side of a two-sided media disc (not shown in FIG. 2). As can be seen in FIG. 2, PECVD source 200 includes a first portion 202 and a second portion 204. During operation of PECVD source 200, a vacuum is established within first portion 202 and second portion 204 is at atmospheric pressure. First portion 202 is separated from second portion 204 by base plate or rear plate 122 and a source shield 206 (also shown in FIGS. 1B and 1C). Base or rear plate 122 includes a gas inlet 208 through which a carbon containing gas (for example, a hydrocarbon gas) is supplied during operation.

First portion or chamber 202 includes a diffuser plate 210 (also shown in FIGS. 1B and 1C) that helps diffuse the gas as it enters the first portion or chamber 202 through the gas inlet 208. Also included in first portion or chamber 200 are an anode 212 and filament 100A (the cathode). As described earlier in connection with FIG. 1B, first end 102A of filament 100A is connected to first filament post extender 114 and second end 104A of filament 100A is connected to second filament post extender 116. First filament post extender 114 is connected to first filament post 118 and second filament post extender 116 is connected to second filament post 120. Filament posts 118 and 120 and anode 212 are mounted on base or rear plate 122. Electrical feedthroughs 214 and 216 in second portion 204 are connected to base or rear plate 122. In the interest of simplification, any additional components/elements that may be included in PECVD source 200 are not shown or described.

Figure 3A:
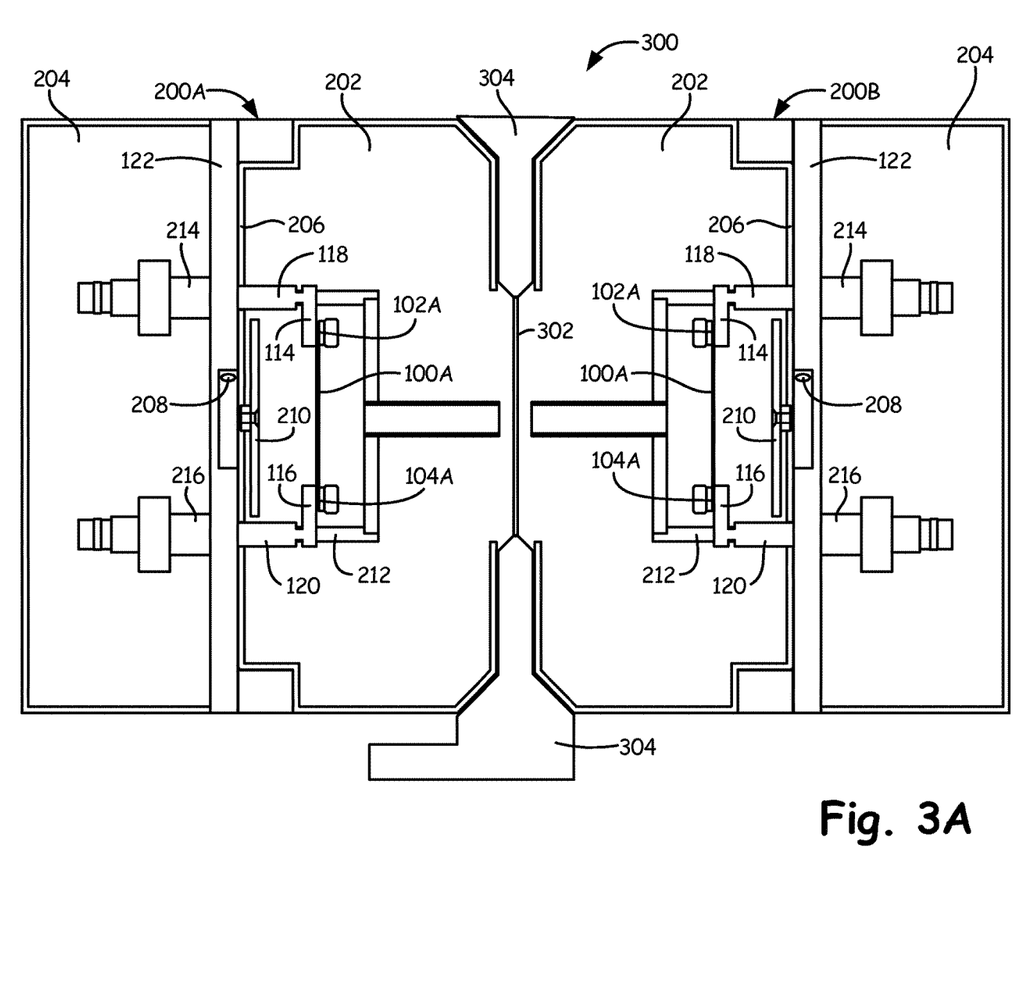
FIG. 3A is a diagrammatic illustration that shows a side sectional view of a deposition tool that includes two chemical vapor deposition sources of the type shown in FIG. 2.

FIG. 3A is a diagrammatic illustration that shows a side sectional view of a carbon deposition tool 300 that includes first and second PECVD sources 200A and 200B, which are substantially similar to the PECVD source 200 described above in connection with FIG. 2. Therefore, a description of elements of individual sources 200A and 200B is not provided.

Figure 3B:
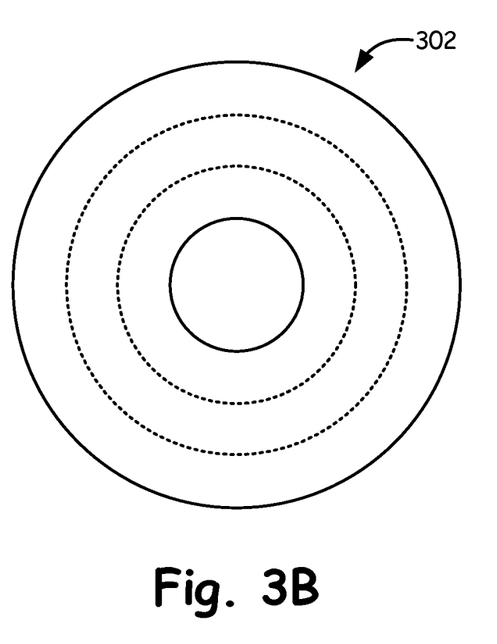
FIG. 3B is a diagrammatic illustration of a surface of a media disc.

A two-sided media disc 302 to be coated with a carbon overcoat on both its sides is held between sources 200A and 200B by a support element 304. In the interest of simplification, details of the support element 304 are not provided. During operation, carbon containing gas is supplied to sources 200A and 200B in a manner described above in connection with FIG. 2. Also, electrical current is run through both filaments 100A in both sources 200A and 200B. The electrical current causes the filaments 100A to heat and emit electrons by thermionic emission. The acceleration of those electrons results in plasma in each of the sources 200A and 200B. Accordingly, in such an embodiment, the carbon material that coats opposing surfaces of two-sided media disc 302 is supplied by emitting electrons by thermionic emission from each PECVD source. One surface of two-sided media disc 302 is shown in FIG. 3B. As indicated above, by providing substantially concentric sources of electrons, filaments 100A in device 300 provide a substantially uniform carbon overcoat on both sides of media disc 302. Further, as noted above, by mounting filament 100A on a plate of each of PECVD sources 200A and 200B, such that a first filament end 102A connected to a first filament post is substantially vertically aligned with a second filament end 104A connected to a second filament post, the shape of filament 100A can be maintained through the lifetime of filament 100A. FIGS. 4A-4D illustrate filament shapes before and after use of the filaments for carbon overcoat deposition.

Figure 4A:
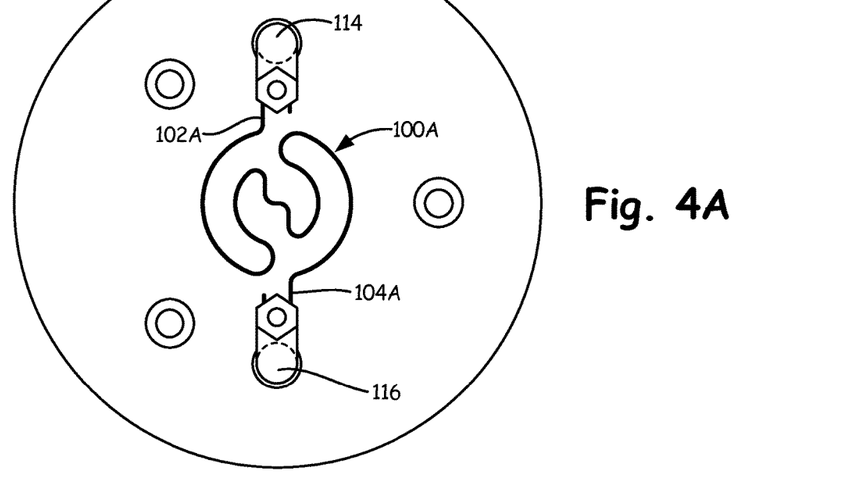
FIGS. 4A-4D are diagrammatic illustrations showings filaments before and after use in carrying out chemical vapor deposition processes.
Figure 4B:
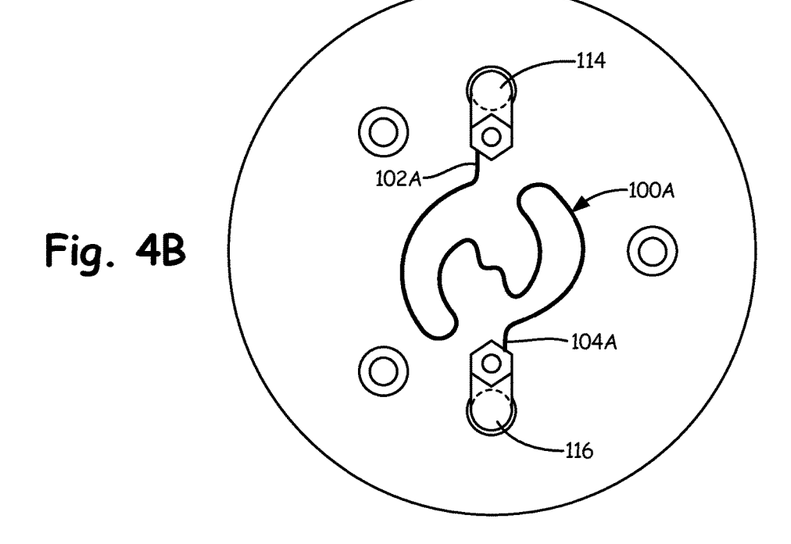
Figure 4C:
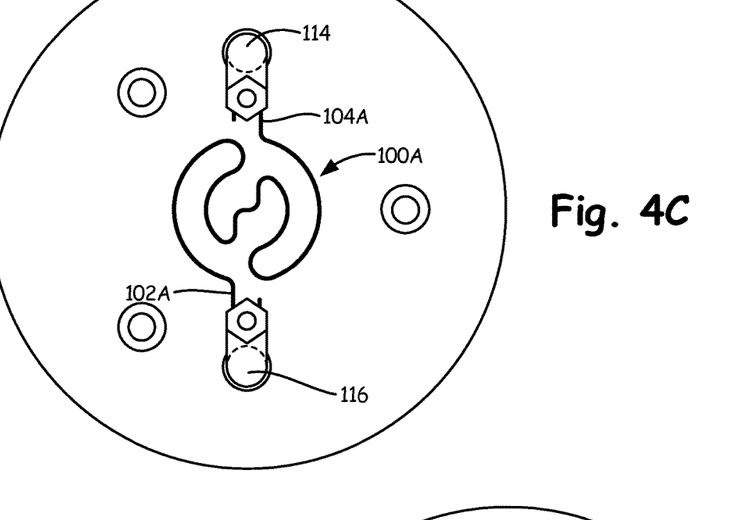
Figure 4D:
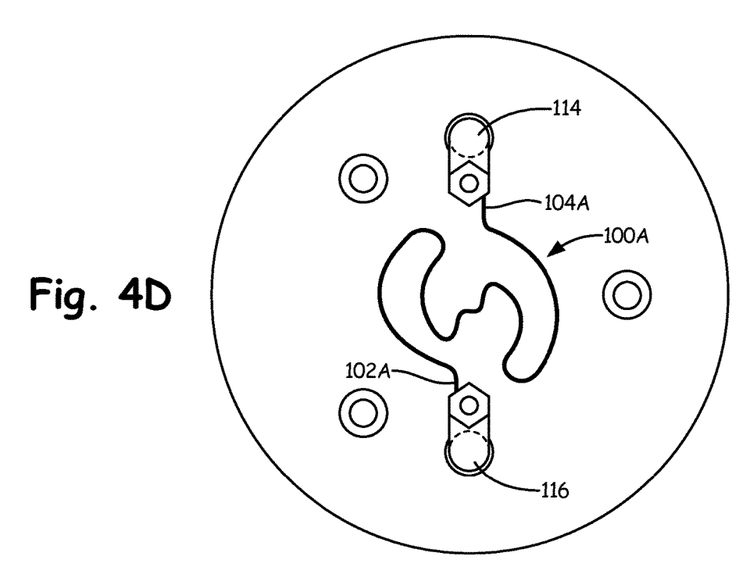

FIG. 4A shows filament 100A before it is used in a carbon deposition process, and FIG. 4B shows filament 100A after the deposition is carried out. In the embodiment shown in FIGS. 4A and 4B, filament 100A is connected to first and second post extenders 114 and 116 such that its first end 102A is vertically above its second end 104A. FIG. 4B shows only slight changes in the shape of filament 100A after being used in a deposition process. It was found that the slight change in shape of filament 100A has no substantial negative impact on carbon overcoats produced using the filament with the slightly altered shape. FIGS. 4C and 4D are similar to FIGS. 4A and 4B, respectively. The only change in FIGS. 4C and 4D is that second filament end 104A is vertically above first filament end 102A. As comparison of FIGS. 4D and 4B shows that the switching of the vertical positions of the filament ends 102A and 104A does not have an impact on an alteration in filament shape after the filament is used in a carbon deposition process.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A chemical vapor deposition source comprising:
   a substantially vertical plate;
   first and second filament posts coupled to the plate;
   a filament having a first end and a second end,
   wherein the filament is configured to provide a substantially concentric source of electrons, and
   wherein the first end of the filament is connected to the first filament post and the second end of the filament is connected to the second filament post, and wherein the filament is unsupported between the first and second ends, and
   wherein the first end of the filament is substantially vertically aligned with the second end of the filament when the filament is connected to the first and second posts.

2. The chemical vapor deposition source of claim 1 and wherein the filament comprises a first curved arm and a second curved arm.

3. The chemical vapor deposition source of claim 2 and wherein the first curved arm is connected to the first end of the filament and wherein the second curved arm is connected to the second end of the filament.

4. The chemical vapor deposition source of claim 3 and wherein the filament further comprises a transition region between the first curved arm and the second curved arm, and wherein a first end of the transition region is connected to the first curved arm and a second end of the transition region is connected to the second curved arm.

5. The chemical vapor deposition source of claim 4 and wherein the transition region comprises a step feature.

6. The chemical vapor deposition source of claim 2 and further comprising:
   a first filament post extension coupled between the first filament post and the first end of the filament; and
   a second filament post extension coupled between the second filament post and the second end of the filament.

7. The chemical vapor deposition source of claim 1 and wherein each of the first end of the filament and the second end of the filament comprises a hook.

8. The chemical vapor deposition source of claim 2 and wherein the first curved arm and the second curved arm are disposed substantially in a same plane.

9. The chemical vapor deposition source of claim 8 and wherein the first curved arm and the second curved arm, disposed substantially in the same plane, are substantially parallel to the substantially vertical plate.

10. A filament comprising:
    a holeless wire comprisng:
       a first end configured to couple to a first filament post of a chemical vapor deposition source;
       a second end configured to couple to a second filament post of the chemical vapor deposition source;
       a first curved arm connected to the first end of the holeless wire;
       a second curved arm connected to the second end of the holeless wire; and
       a transition region between the first curved arm and the second curved arm, and wherein a first end of the transition region is connected to the first curved arm and a second end of the transition region is connected to the second curved arm.

11. The filament of claim 10 and wherein the first curved arm and the second curved arm, connected via the transition region, are configured to provide a substantially concentric source of electrons.

12. The filament of claim 10 and wherein the transition region comprises a step feature.

13. The filament of claim 10 and wherein each of the first end of the holeless wire and the second end of the holeless wire comprises a hook.

14. The filament of claim 10 and wherein the first curved arm and the second curved arm are disposed substantially in a same plane.

15. A vapor deposition tool comprising:
a plasma enhanced chemical vapor deposition source having a vertically positioned cathode filament that is separate from an anode of the vapor deposition tool, the cathode filament provides a substantially concentric source of electrons,
wherein the vertically positioned cathode filament comprises a first end and a second end, and
wherein the first end of the cathode filament is substantially vertically aligned with the second end of the cathode filament.

16. The vapor deposition tool of claim 15 and wherein the cathode filament comprises a first curved arm and a second curved arm.

17. The vapor deposition tool of claim 16 and wherein the first curved arm is connected to the first end of the cathode filament and wherein the second curved arm is connected to the second end of the cathode filament.

18. The vapor deposition tool of claim 17 and wherein the cathode filament further comprises a transition region between the first curved arm and the second curved arm, and wherein a first end of the transition region is connected to the first curved arm and a second end of the transition region is connected to the second curved arm.

19. The vapor deposition tool of claim 18 and wherein the transition region comprises a step feature.

20. The filament of claim 16 and wherein the first curved arm and the second curved arm are disposed substantially in a same plane.

* * * * *